United States Patent
Lin

(10) Patent No.: US 7,543,213 B2
(45) Date of Patent: Jun. 2, 2009

(54) TURBO DECODER AND DYNAMIC DECODING METHOD USED FOR SAME

(75) Inventor: Hua Lin, Tokyo (JP)

(73) Assignee: NEC Corporation (JP)

( * ) Notice: Subject to any disclaimer, the term of this patent is extended or adjusted under 35 U.S.C. 154(b) by 551 days.

(21) Appl. No.: 10/850,659

(22) Filed: May 21, 2004

(65) Prior Publication Data

US 2004/0237019 A1 Nov. 25, 2004

(30) Foreign Application Priority Data

May 21, 2003 (JP) ............................. 2003-142798

(51) Int. Cl.
 *H03M 13/00* (2006.01)
(52) U.S. Cl. ..................... 714/755; 714/801; 375/308
(58) Field of Classification Search ................. 714/755
 See application file for complete search history.

(56) References Cited

U.S. PATENT DOCUMENTS

| | | | | |
|---|---|---|---|---|
| 6,625,778 | B1 * | 9/2003 | Nakamura et al. | 714/786 |
| 6,745,352 | B2 * | 6/2004 | Cheng | 714/704 |
| 6,807,239 | B2 * | 10/2004 | Sugimoto et al. | 375/341 |
| 6,888,901 | B2 * | 5/2005 | Yu et al. | 375/341 |
| 7,027,533 | B2 * | 4/2006 | Abe et al. | 375/341 |
| 2003/0005388 | A1 * | 1/2003 | Fukumasa | 714/786 |
| 2003/0014712 | A1 | 1/2003 | Yano et al. | |
| 2004/0260995 | A1 * | 12/2004 | Allpress | 714/755 |
| 2005/0047514 | A1 * | 3/2005 | Bolinth et al. | 375/261 |

FOREIGN PATENT DOCUMENTS

| | | |
|---|---|---|
| JP | WO 00/52832 | 9/2000 |
| JP | 2002-190745 | 7/2002 |
| JP | 2002-344330 | 11/2002 |
| JP | 2003-023359 | 1/2003 |

OTHER PUBLICATIONS

Untranslated Chinese Action issued on Feb. 16, 2007 in connection with corresponding Chinese application No. 200410042372.7.

(Continued)

*Primary Examiner*—Esaw T Abraham
*Assistant Examiner*—Enam Ahmed
(74) *Attorney, Agent, or Firm*—Ostrolenk, Faber, Gerb & Soffen, LLP

(57) ABSTRACT

To provide a turbo decoding method capable of significantly improving efficiency of a determination as to whether or not to end decoding.

If the decoding by a turbo decoder is started, a soft decision value of an element decoder is derived, and an ECR of a current frame is estimated from the soft decision value by an ECR criterion deriving portion. If determined to be an end as a result of an end determination of the decoding by the turbo decoder from a result of comparison with a last ECR value and the maximum number of times of repetition of decoding, a hard decision result and a decoding result are outputted, and if not determined to be the end, the number of times of repetition is counted up so as to repeat the above process.

6 Claims, 5 Drawing Sheets

OTHER PUBLICATIONS

English translation of Chinese Office Action issued in connection with 200410042372.7 submitted in lieu of statement of relevancy of prior art teachings to the instant application.

European Search Report dated Feb. 18, 2008 issued in corresponding European Patent Application No. 04090205.

Ambroze A et al: "Practical Aspects of Iterative Decoding" IEE Proceedings: Communications, Institution of Electrical Engineers, GB, vol. 147, No. 2, Apr. 2000, pp. 69-74, XP000950126 ISSN: 1350-2425.

Shao R Y et al: "Two simple stopping criteria for iterative decoding" Information Theory, 1998. Proceedings. 1998 IEEE International Symposium on Cambridge, MA, USA Aug. 16-21, 1998, New York, NY, USA, IEEE, US, Aug. 16, 1998, p. 279, XP010297151 ISBN: 0-7803-5000-6.

* cited by examiner

TURBO DECODER AND DYNAMIC DECODING METHOD USED FOR SAME

BACKGROUND OF THE INVENTION

1. Field of the Invention

The present invention relates to a turbo decoder and a dynamic decoding method used for it, and in particular, to a method of controlling the number of times of repetition of decoding in the turbo decoder.

2. Description of the Related Art

To prevent deterioration of receiving quality of a radio communications system, a high error-correction coding technology is essential. Turbo coding is an error-correction coding method for realizing transmission characteristics close to a limit of information theory, and is characterized by concatenation encoding for creating a code word by connecting sequences in which an information sequence and the information sequence rearranged are encoded by element encoders respectively and repetition decoding for repeatedly performing decoding corresponding to each element code while utilizing the other decoding result (refer to pp. 5 to 6 and FIG. 2, Japanese Patent Laid-Open No. 2002-190745 for instance).

As for a conventional repetition decoding method, it is ordinary that the number of times of repetition is prescribed in advance. The number of times of repetition is set based on a result of performance evaluation by means of computer simulation and so on.

And no control for dynamically changing the number of times of repetition is normally exerted. In general, soft input and soft output decoding performed a plurality of times in the repetition decoding has a large calculation amount.

As for a conventional repetition decoding method, however, there are the cases where most of receiving sequences are correctly decoded by repeating decoding operation a few times due to an unstable state of a communication channel. And even though the correct decoding results are already obtained by a general decoding method of repetition of a fixed number of times, repetition decoding is implemented a predetermined number of times.

On the other hand, errors have significantly decreased as to the conventional repetition decoding method, and there are the cases where it is very likely to have all the errors corrected by performing a decoding process once more. However, if a conventional turbo decoder performs the decoding a set number of times, it outputs the decoding results including the errors as-is without considering this state. Therefore, a dynamic decoding method is a subject for the sake of realizing an effective turbo decoding.

SUMMARY OF THE INVENTION

Thus, an object of the present invention is to provide a turbo decoder and a dynamic decoding method used for it capable of solving the problems and significantly improving efficiency of determination as to whether or not to end the decoding.

A turbo decoder according to the present invention is a turbo decoder used for a system for performing a concatenation encoding process for creating a code word by connecting sequences in which an information sequence and the information sequence rearranged are encoded by element encoders respectively and a repetition decoding process for repeatedly performing decoding corresponding to each element code of element decoders while utilizing the other decoding result, wherein the decoder has means for deriving a soft decision value of the element decoder for performing soft decision decoding for the sake of estimating transmitted data; and means for estimating an average estimated correct ratio of a frame from the derived soft decision value; and means for determining an end of there petition decoding process based on the average estimated correct ratio.

A dynamic decoding method according to the present invention is a dynamic decoding method used for a system including an encoder for performing the concatenation encoding process for creating the code word by connecting the sequences in which the information sequence and the information sequence rearranged are encoded by element encoders respectively and a decoder for performing the repetition decoding process for repeatedly performing decoding corresponding to each element code of element decoders while utilizing the other decoding result, wherein the decoder side has steps of deriving a soft decision value of the element decoder for performing soft decision decoding for the sake of estimating transmitted data; estimating an average estimated correct ratio of a frame from the derived soft decision value; and determining the end of the repetition decoding process based on the average estimated correct ratio.

To be more specific, the dynamic decoding method according to the present invention determines the end of repetition of the soft decision decoding by estimation of an ECR (Estimated Correct Ratio: average estimated correct ratio of frame data) in the turbo decoding in a radio communications system so as to improve the efficiency of the determination.

According to the dynamic decoding method of the present invention, processing speed of the turbo decoding is improved, and it can be implemented by adding a simple architecture so that its implementation is easy.

According to the dynamic decoding method of the present invention, it is possible, as described above, to significantly improve the efficiency of the determination as to whether or not to end the decoding. Therefore, it improves the processing speed of the turbo decoding and eliminates redundant decoding operation of the turbo decoding so as to allow power consumption of the apparatus to be reduced.

And the dynamic decoding method of the present invention can be implemented by adding a simple circuit. Therefore, implementation thereof becomes easier, and the number of times of decoding becomes dynamically controllable against the state of the communication channel and so on so that decoding precision can be improved.

Such improved efficiency of an end determination process of the decoding is especially required in the case of mounting the turbo decoder on the apparatus strictly requiring communication to be in real time such as a portable telephone.

DETAILED DESCRIPTION OF THE PREFERRED EMBODIMENTS

Figure 1:
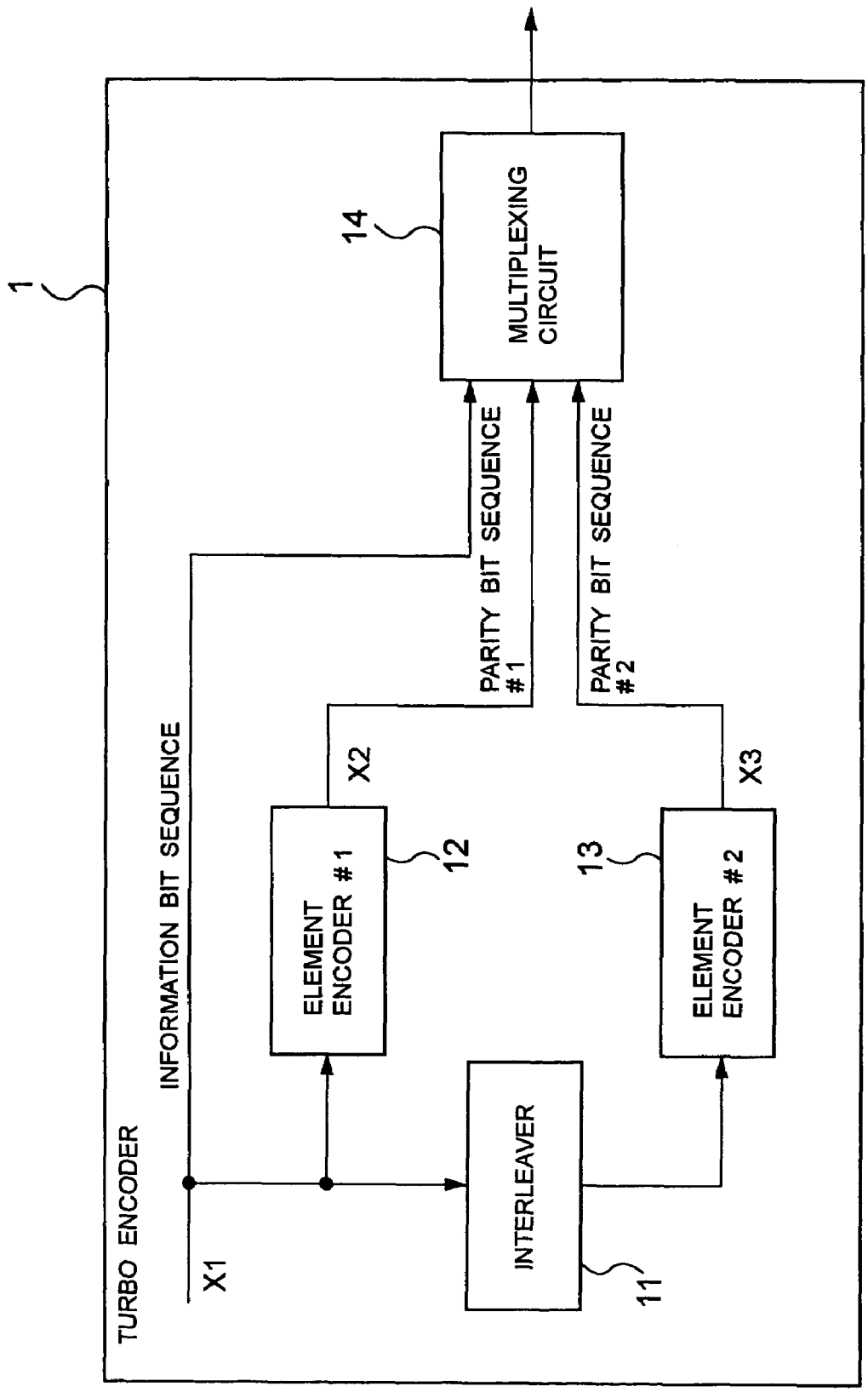
FIG. 1 is a block diagram showing the configuration of a turbo encoder according to an embodiment of the present invention.

Next, a preferred embodiment of the present invention will be described by referring to the drawings. FIG. 1 is a block diagram showing a configuration of a turbo encoder according to an embodiment of the present invention. In FIG. 1, a turbo encoder 1 is comprised of an interleaver 11, element encoders (#1, #2) 12 and 13 and a multiplexing circuit 14, and outputs transmission data, data having the transmission data convolution-coded and the data having interleaved transmission data convolution-coded.

To be more specific, the turbo encoder 1 performs concatenation encoding for creating a code word by connecting with the multiplexing circuit 14 sequences in which an information sequence X1 and the information sequence rearranged by the interleaver 11 are encoded by the element encoders (#1, #2) 12 and 13 respectively.

Figure 2:
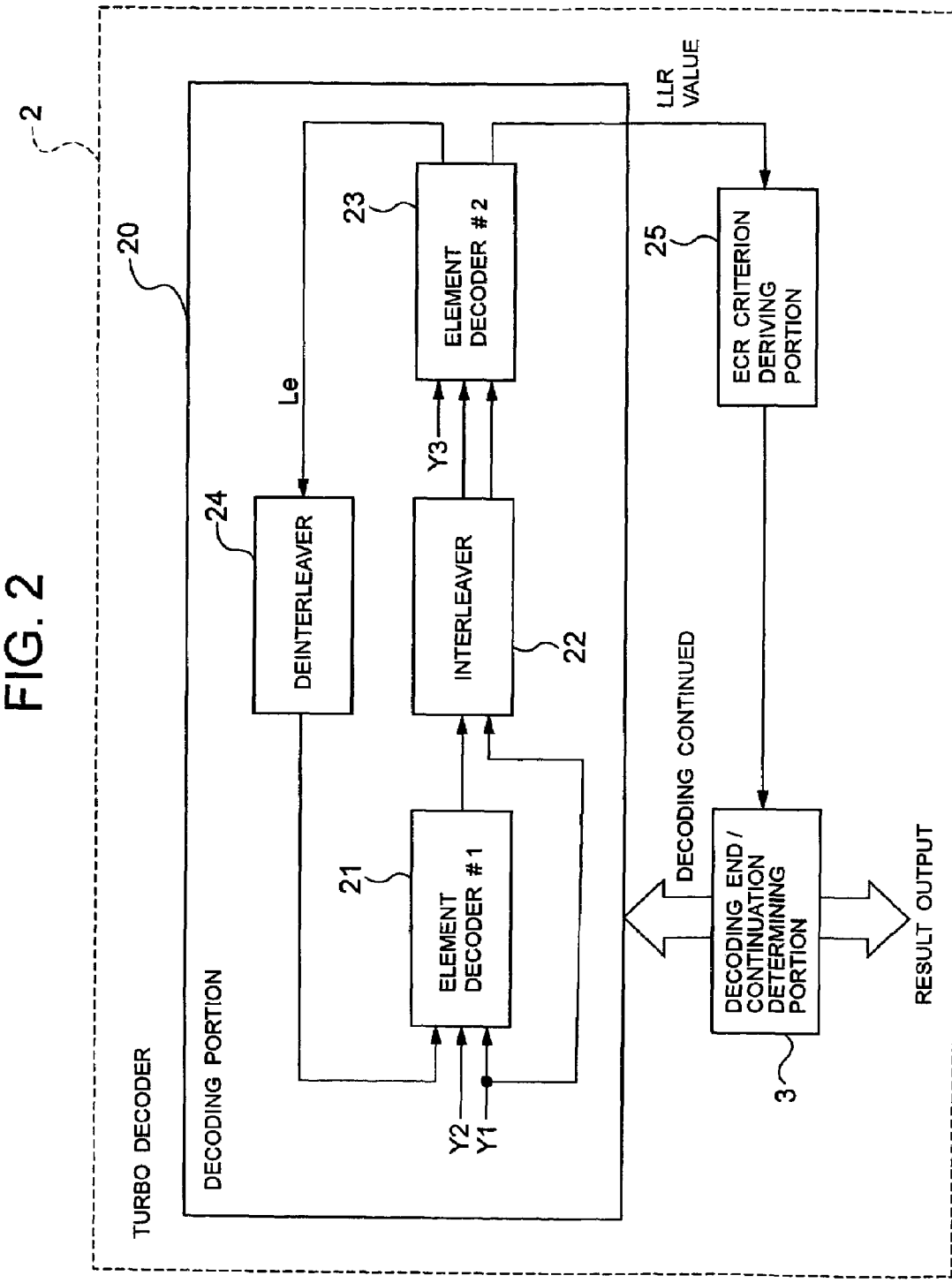
FIG. 2 is a block diagram showing the configuration of a turbo decoder according to the embodiment of the present invention.

FIG. 2 is a block diagram showing the configuration of a turbo decoder according to the embodiment of the present invention In FIG. 2, a turbo decoder 2 is comprised of a decoding portion 20 having element decoders (#1, #2) 21 and 23, an interleaver 22 and a deinterleaver 24, an ECR (Estimated Correct Ratio: average estimated correct ratio of frame data) criterion deriving portion 25 and a decoding end/continuation determining portion 3.

The decoding portion 20 of the turbo decoder 2 performs repetition decoding for repeatedly performing decoding corresponding to each element code of the element decoders (#1, #2) 21 and 23 while utilizing the other decoding result.

To be more specific, the turbo decoder 2 performs soft decision decoding (estimating transmitted data) with two decoders (element decoders (#1, #2) 21 and 23) corresponding to two convolution encoders (element encoders (#1, #2) 12 and 13). And it repeatedly performs the decoding while feeding back the result of one decoder to the other decoder so as to eventually make a hard decision and thereby determine "1" and "0" of received data.

Reliability characteristics of the turbo decoding are improved as the number of times of repetition of the soft decision decoding is increased. However, it also leads to a problem of delay in processing due to the increased number of times of repetition. And there arises a problem of an increase in power consumption of a decoding system.

Figure 3:
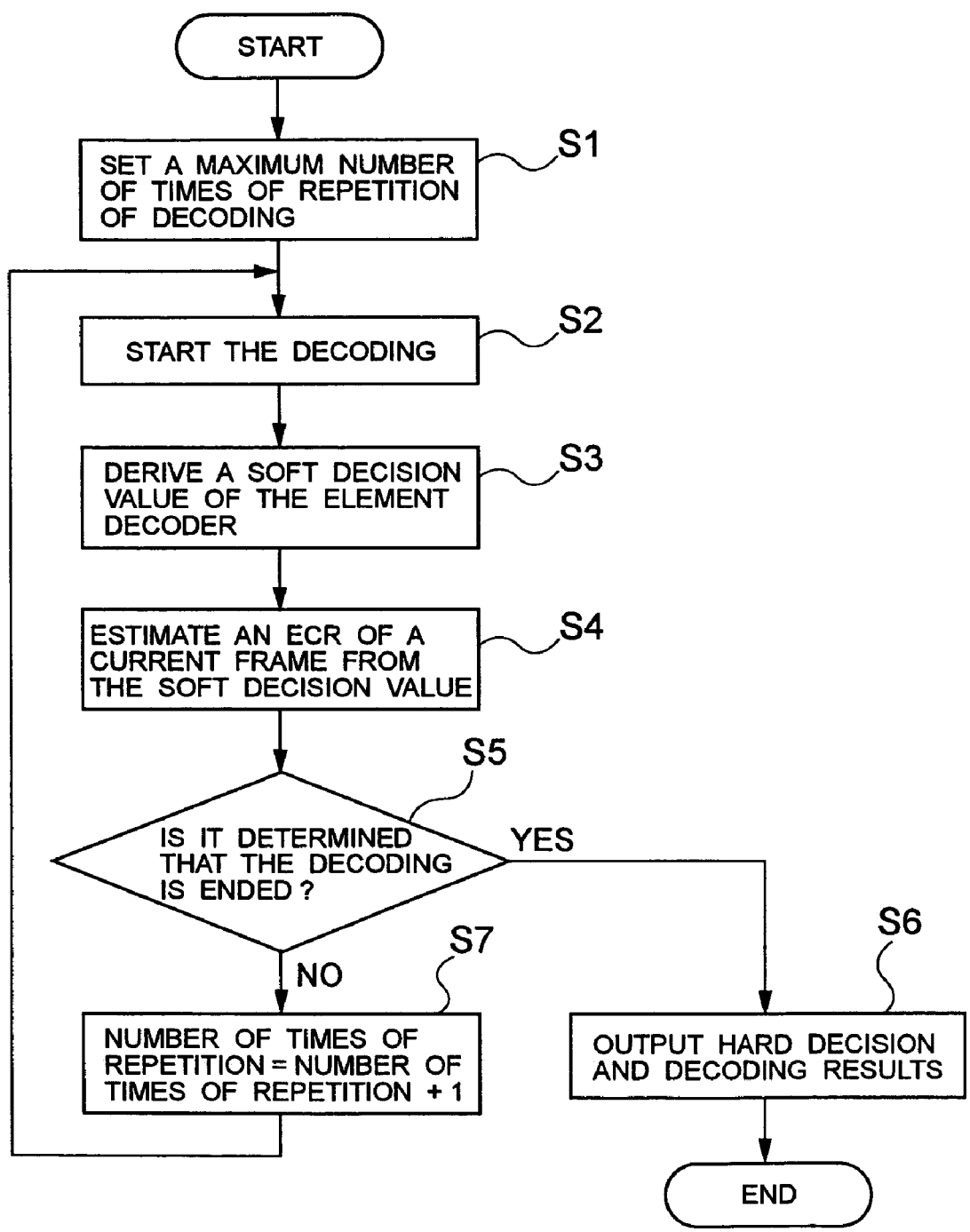
FIG. 3 is a flowchart showing a dynamic decoding method according to the embodiment of the present invention.

FIG. 3 is a flowchart showing a dynamic decoding method according to the embodiment of the present invention. A description will be given by referring to FIGS. 1 to 3 as to the dynamic decoding method according to the embodiment of the present invention.

According to the dynamic decoding method of this embodiment, a maximum number of times of repetition of decoding is set first (step S1 in FIG. 3), and then the decoding by the turbo decoder 2 is started (step S2 in FIG. 3).

Subsequently, according to this embodiment, a soft decision value of the element decoder (#2) 23 is derived (step S3 in FIG. 3), and the ECR of a current frame is estimated based on the soft decision value by the ECR criterion deriving portion 25 (step S4 in FIG. 3).

The decoding end/continuation determining portion 3 performs determination as to whether or not to end the decoding by the turbo decoder 2 based on a result of comparison with the ECR value of a last frame and the maximum number of times of repetition of decoding (step S5 in FIG. 3). If not determined to be the end of the decoding by the turbo decoder 2, it counts up the number of times of repetition (step S7 in FIG. 3), and returns to the step S2 to repeat the above process. If determined to be the end of the decoding by the turbo decoder 2, the decoding end/continuation determining portion 3 outputs a hard decision result and the decoding result (step S6 in FIG. 3) and finishes the process.

As described above, according to this embodiment, attention is focused on the soft decision value and the ECR is derived for each frame by the output of the element decoder (#2) 23. Then, the current ECR value is compared to the last ECR value, and if it is higher than the last ECR value, further error correction of the decoder is determinedly expected so as to continue the repetition decoding process. If it is not higher than the last ECR value, according to this embodiment, it is determined to be in a saturated state of the decoding so as to finish the repetition and output the last decoding result.

Figure 4:
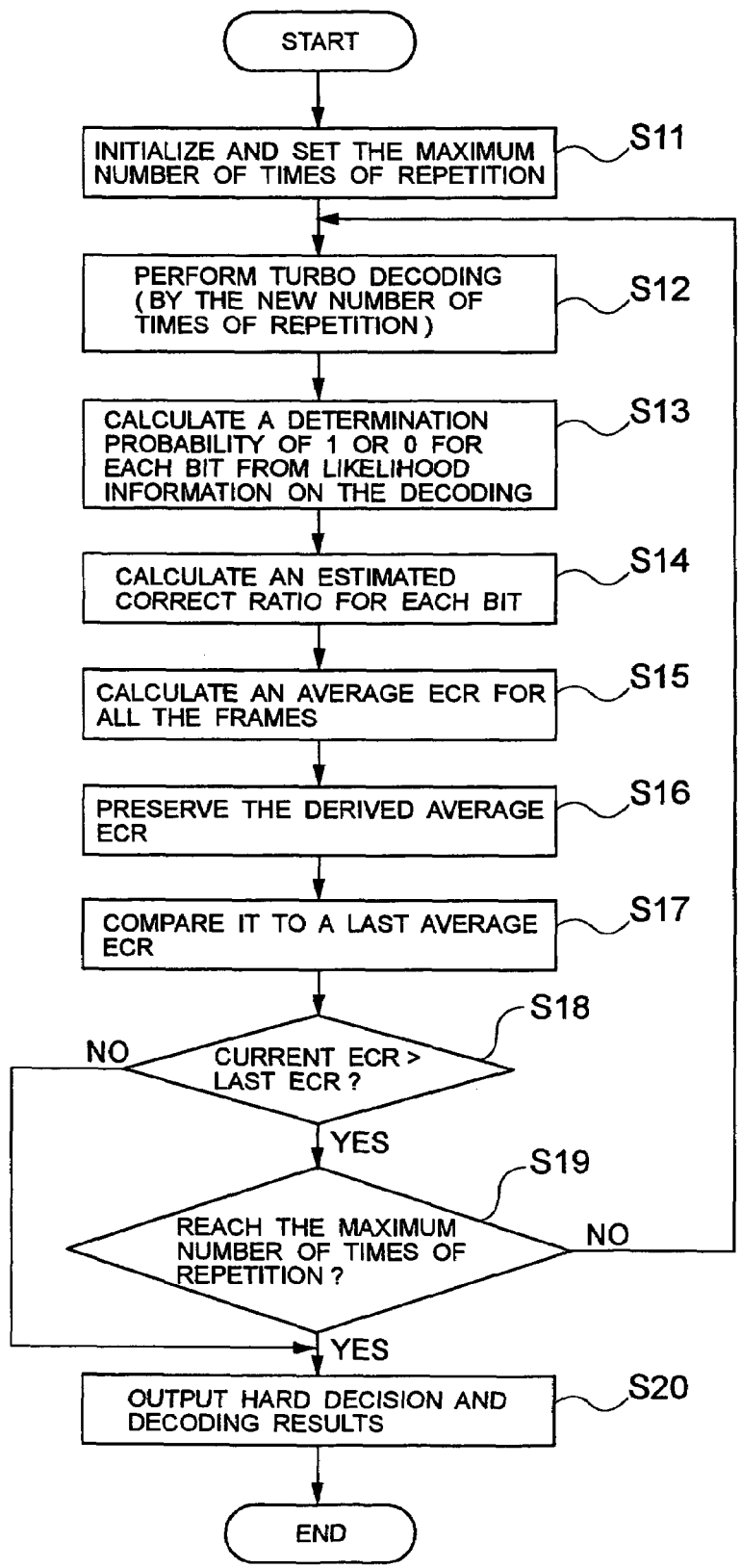
FIG. 4 is a flowchart showing calculation of an ECR based on a soft decision value of the turbo decoder in FIG. 2 and a process of executing dynamic decoding based on the ECR.

FIG. 4 is a flowchart showing calculation of the ECR based on the soft decision value of the turbo decoder 2 in FIG. 2 and the process of executing dynamic decoding based on the ECR. In FIG. 4, steps S11 to S15 show the process of calculating the ECR based on the soft decision value of the turbo decoder 2, and steps S16 to S20 show the process of executing the dynamic decoding based on the ECR.

Subsequently, a description will be given by referring to FIGS. 1 and 2 as to general operation of the repetition decoder according to this embodiment. As shown in FIGS. 1 and 2, on a receiving side, receiving sequences Y1, Y2 and Y3 having noise mixed with received information bit sequence X1 and parity bit sequences X2 and X3 on a communication channel are inputted to the turbo decoder 2.

On the receiving side, external information Le is calculated from Y1 and Y2 on the element decoder (#1) 21 (first soft input and soft output decoder) first in a repetition decoding algorithm of the turbo decoder 2.

Next, on the receiving side, the external information Le is updated from Y1, Y3 and Le on the element decoder (#2) 23 (second soft input and soft output decoder), and the updated external information Le is fed back to the element decoder (#1) 21 so as to repeat the above process.

According to this embodiment, a transmission data sequence is reproduced by hard-deciding a log likelihood ratio (LLR) L ($b_k$) after repeating the process m times. An LLR value L ($b_k$) against a bit $b_{k0}$ after the decoding is represented by the following formula.

$$L(b_k) = \ln\left[\frac{P(b_{k0} = 1)}{P(b_{k0} = 0)}\right] \qquad 1$$

In this formula 1, P ($b_{k0}$=1) and P ($b_{k0}$=0) are probabilities to be $b_{k0}$=1 and $b_{k0}$=0 respectively. The LLR value L ($b_k$) is represented as $L_i$ ($b_k$) considering the number of times of repetition. Here, i denotes the current number of times of decoding.

As for the turbo decoding, the decoding is repeatedly performed while ordinarily updating the external information Le. For this reason, it is necessary to specify the number of times of repetition. However, it is difficult to securely specify the number of times of repetition since it is an experimental parameter. Therefore, it must be a specification for securely ending the decoding, that is, a fixed value.

In the case where the decoding is completed at less than the specified number of times of repetition, however, it is desirable to end the decoding because the decoding after completion thereof is meaningless. According to this embodiment, as shown in the steps S11 to 15 in FIG. 4, a criterion of the number of times of repetition necessary for the turbo decoding is derived from the calculation of the average estimated correct ratio (ECR) of each piece of frame data.

To be more specific, it is possible to estimate P ($b_{k0}$=1) and P ($b_{k0}$=0) with the formula 1 as shown in the following formulas.

$$P_i(b_{k0} = 1) = \frac{\exp(L_i(b_k))}{1 + \exp(L_i(b_k))} \qquad 2$$

$$P_i(b_{k0} = 0) = \frac{1}{1 + \exp(L_i(b_k))} \qquad 3$$

The estimated correct ratio of each bit can be represented by the following formula according to the formulas 2 and 3.

$$P_i(b_{k0} = b_k) = \frac{(\exp(L_i(b_k)))^{b_{10}}}{1 + \exp(L_i(b_k))} \qquad 4$$

The average estimated correct ratio (ECR) is represented by the following formula for all the frame data. Here, N denotes length of the frame data (the number of bits of the frame) and $b_{k0}$ denotes an estimate bit value (hard decision value of the decoder output).

$$ECR_i = \frac{\sum_{k=1}^{N} \frac{(\exp(L_i(b_k)))^{b_{10}}}{1 + \exp(L_i(b_k))}}{N} \qquad 5$$

As for the turbo decoding, the number of errors in the decoding result decreases as the number of times of repetition of the decoding process increases. There are the cases, however, where the error correction cannot be improved and the errors remain even if the number of times of decoding is increased depending on the state of the communication channel and so on. In other words, the decoding becomes saturated. There are also the cases where the number of errors significantly decreases and all the errors are likely to be corrected by performing the decoding process once more.

The conventional turbo decoder outputs the decoding result including the errors as-is without considering this state if the set number of times of decoding is performed. As opposed to this, according to this embodiment, the derived ECR is considered as error correction capability of the turbo decoder 2, and it is checked whether or not to end the decoding by comparing a current average ECR to a last average ECR. Therefore, it is possible to improve the efficiency of the determination of whether or not to end the decoding.

Figure 5:
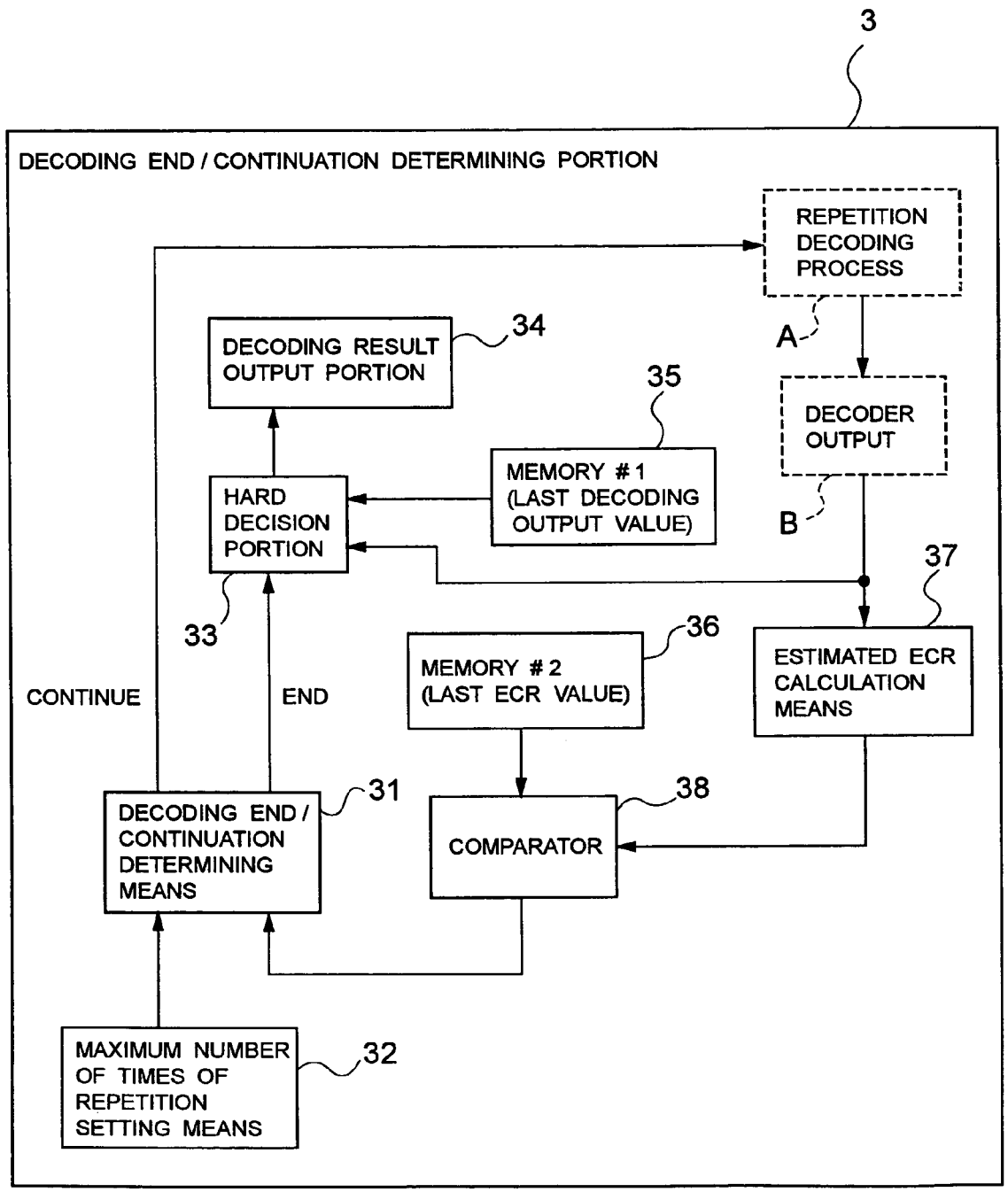
FIG. 5 is a block diagram showing the configuration of a decoding end/continuation determining portion in FIG. 2.

FIG. 5 is a block diagram showing the configuration of the decoding end/continuation determining portion 3 in FIG. 2. In FIG. 5, the decoding end/continuation determining portion 3 is comprised of decoding end/continuation determining means 31, maximum number of times of repetition setting means 32, a hard decision portion 33, a decoding result output portion 34, memories (#1, #2) 35 and 36, estimated ECR calculation means 37 and a comparator 38.

The memory (#1) 35 has a last decoding output value stored therein, and the memory (#2) 36 has a last ECR value stored therein. The ECR calculation means 37 calculates an estimated ECR from a decoder output B by a repetition decoding process A, and sends a calculation result to the comparator 38.

The comparator 38 compares the calculation result of the estimated ECR calculation means 37 to the last ECR value stored in the memory (#2) 36, and sends a comparison result thereof to the decoding end/continuation determining means 31.

The decoding end/continuation determining means 31 makes a determination of whether to end or continue the decoding based on the maximum number of times of repetition set by the maximum number of times of repetition setting means 32 and the comparison result of the comparator 38. If the decoding is determined to continue, the decoding end/continuation determining means 31 notifies the repetition decoding process A thereof. If the decoding is determined to end, it notifies the hard decision portion 33 thereof.

When notified of the end from the decoding end/continuation determining means 31, the hard decision portion 33 makes a hard decision from the decoder output B by the repetition decoding process A and the last decoding output value stored in the memory (#1) 35 so as to have the hard decision result and the decoding result outputted from the decoding result output portion 34.

The decoding end/continuation determining portion 3 derives the estimated correct ratio of each bit and the ECR of a frame according to the log likelihood ratio of the element decoder (#2) 23. The decoding end/continuation determining portion 3 needs to preserve this ECR value in order to compare it to a next ECR value.

In the case where a current ECR value is larger than the ECR value stored last time, the decoding process should be continued. In the case where the current ECR value is equal to or smaller than the ECR value stored last time, however, the decoding is saturated so that an ending condition of the decoding is satisfied, a last decoding output is hard-decided and the decoding result is obtained.

In the case where the increase in the ECR value is very slow even if the number of times of repetition of decoding is increased, the maximum number of times of repetition of decoding is set in order to improve decoding efficiency. If the number of times of repetition reaches the maximum number of times of repetition of decoding, a current log likelihood ratio of the decoder is hard-decided and the decoding result is outputted. It is possible, by this process, to handle the cases where the number of times of repetition of decoding cannot be restored to its normal state. The steps S16 to S20 in FIG. 4 show the processing of the dynamic decoding process A.

Thus, it is possible, according to this embodiment, to determine the end of repetition of a soft decision decoding by estimating the ECR in the turbo decoding in the radio communications system so as to significantly improve the efficiency of the determination of whether or not to end the decoding. According to this embodiment, the processing speed of the turbo decoding is there by improved, and redundant decoding operation of the turbo decoding is eliminated so as to allow power consumption of the apparatus to be reduced.

And this embodiment can be implemented by adding a simple circuit, and so the implementation thereof becomes easier. Furthermore, the number of times of decoding is dynamic according to situation of the communication channel and so on so that decoding precision can be improved. Such efficiency of the end determination process of the decoding is especially required in the case of mounting the turbo decoder on the apparatus strictly requiring communication to be in real time such as a portable telephone.

The present invention described the radio communications system. However, it is not limited thereto but is also applicable to a recording medium data reproduction apparatus, an optical communication transmission system, a deep space telecommunication (satellite communication) system and so on. And the turbo decoding method of the present invention is not limited to the above embodiment but is also applicable to an alternative example, a modified example, a deformed example and so on without deviating from the present invention.

As described above, it is possible, according to the present invention, to obtain the effect of significantly improving the efficiency of the determination of whether or not to end the decoding by adopting the above configuration and operation.

What is claimed is:

1. A turbo decoder used for a system for performing a concatenation encoding process for creating a code word by connecting sequences in which an information sequence and the information sequence rearranged are encoded by a plurality of encoders respectively and a repetition decoding process for repeatedly performing decoding corresponding to each code of the plurality of decoders while utilizing another decoding result, wherein the decoder comprises first means for deriving a soft decision value of the decoder for performing soft decision decoding for estimating transmitted data; second means for estimating an average estimated correct ratio of a frame from the derived soft decision value; and third means for determining an end of the repetition decoding process based on the average estimated correct ratio, wherein the third means determines the end of the repetition decoding process according to a result of comparison between the average estimated correct ratio of a current frame and the average estimated correct ratio of a previous frame, and the third means determines the repetition decoding process to continue when the average estimated correct ration of the current frame is higher than the average estimated correct ratio of the previous frame and determines the repetition decoding process to end when the average estimated correct ratio of the current frame is not higher than the average estimated correct ratio of the previous frame.

2. The turbo decoder according to claim 1, wherein it includes means for setting a maximum number of times of repetition of decoding in the case where an increase in the average estimated correct ratio is slow even if the number of times of repetition of the repetition decoding process is increased.

3. The turbo decoder according to claim 1, wherein the second means estimates the average estimated correct ratio based on an estimated correct ratio of each bit derived from a log likelihood ratio of the element decoder.

4. A dynamic decoding method used for a system including an encoder for performing a concatenation encoding process for creating a code word by connecting sequences in which an information sequence and the information sequence rearranged are encoded by a plurality of encoders respectively and a decoder for performing repetition decoding process for repeatedly performing decoding corresponding to each code of the plurality of decoders while utilizing another decoding result, wherein the decoder side comprises a first step for deriving a soft decision value of the decoder for performing soft decision decoding for estimating transmitted data; a second step of estimating an average estimated correct ratio of a frame from the derived soft decision value; and third step of determining an end of the repetition decoding process based on the average estimated correct ratio, wherein the third step determines the end of the repetition decoding process according to a result of comparison between the average estimated correct ratio of a current frame and the average estimated correct ratio of a previous frame, and the third step determines the repetition decoding process to continue when the average estimated correct ratio of the current frame is higher than the average estimated correct ratio of the previous frame and determines the repetition decoding process to end when the average estimated correct ratio of the current frame is not higher than the average estimated correct ratio of the previous frame.

5. The dynamic decoding method according to claim 4, wherein the decoder side includes the step of setting a maximum number of times of repetition of decoding in the case where an increase in the average estimated correct ratio is slow even if the number of times of repetition of the repetition decoding process is increased.

6. The dynamic decoding method according to claim 4, wherein the second step estimates the average estimated correct ratio based on an estimated correct ratio of each bit derived from a log likelihood ratio of the element decoder.

* * * * *